(12) United States Patent
Berney (10) Patent No.: US 8,895,922 B2
(45) Date of Patent: Nov. 25, 2014

(54) ELECTRON BEAM APPARATUS

(75) Inventor: Jean Berney, Lausanne (CH)

(73) Assignee: Ecole Polytechnique Federale de Lausanne (EPFL), Lausanne (CH)

( * ) Notice: Subject to any disclaimer, the term of this patent is extended or adjusted under 35 U.S.C. 154(b) by 0 days.

(21) Appl. No.: 14/003,030

(22) PCT Filed: Mar. 15, 2012

(86) PCT No.: PCT/EP2012/054511
§ 371 (c)(1),
(2), (4) Date: Sep. 4, 2013

(87) PCT Pub. No.: WO2012/126792
PCT Pub. Date: Sep. 27, 2012

(65) Prior Publication Data
US 2013/0341527 A1     Dec. 26, 2013

(30) Foreign Application Priority Data

Mar. 18, 2011  (CH) .................................. 0456/11

(51) Int. Cl.
*G21K 5/04*    (2006.01)
*H01J 37/073*  (2006.01)

(52) U.S. Cl.
CPC ................. *G21K 5/04* (2013.01); *H01J 37/073* (2013.01); *H01J 2201/342* (2013.01); *H01J 2237/06333* (2013.01); *H01J 2237/065* (2013.01)
USPC .................. 250/307; 250/306; 250/396 R (58) Field of Classification Search
CPC ......... G21K 5/04; H01J 37/073; H01J 37/317
USPC .......................................................... 250/307
See application file for complete search history.

(56) References Cited

U.S. PATENT DOCUMENTS

| | | | |
|---|---|---|---|
| 4,820,927 A * | 4/1989 | Langner et al. | 250/492.2 |
| 4,829,177 A * | 5/1989 | Hirsch | 250/306 |
| 4,829,927 A | 5/1989 | Berret et al. | |
| 4,868,380 A * | 9/1989 | Booman et al. | 250/214.1 |
| 5,041,724 A | 8/1991 | Feuerbaum et al. | |

(Continued)

FOREIGN PATENT DOCUMENTS

| EP | 0083489 A2 | 12/1989 |
|---|---|---|
| EP | 0760525 A1 | 3/1997 |
| EP | 0969325 A2 | 1/2000 |
| EP | 0989584 A1 | 2/2000 |

OTHER PUBLICATIONS

International Search Report for application PCT/EP2012/054511 dated Jun. 13, 2012.

*Primary Examiner* — Phillip A Johnston
(74) *Attorney, Agent, or Firm* — Pearne & Gordon LLP (57) ABSTRACT

A method suitable for preparing a specimen for inspection, the method comprising the steps of: irradiating a photocathode so that the photocathode emits electrons from a surface of the photocathode, wherein the emitted electrons each follow a trajectory, and the trajectories of the electrons are such that they can be extrapolated to intersect at a region within the photocathode, the region defining a virtual source, and wherein the photocathode comprises a rounded tip which has a radius of curvature; configuring the emitted electrons so that they form an electron beam; focusing the electron beam onto a specimen to form an image of the virtual source on the specimen. There is further provided a corresponding electron beam apparatus.

14 Claims, 5 Drawing Sheets

(56) References Cited

U.S. PATENT DOCUMENTS

| | | |
|---|---|---|
| 5,270,643 A | 12/1993 | Richardson et al. |
| 5,895,919 A | 4/1999 | Frosien et al. |
| 6,215,128 B1 | 4/2001 | Mankos et al. |
| 6,844,560 B2 * | 1/2005 | Wieland et al. .......... 250/492.24 |
| 7,161,162 B2 | 1/2007 | Maldonado et al. |
| 7,601,042 B2 * | 10/2009 | Srinivasan-Rao et al. ...... 445/23 |
| 2010/0127170 A1 | 5/2010 | Fujita et al. |

* cited by examiner

ELECTRON BEAM APPARATUS

FIELD OF THE INVENTION

The present invention concerns an electron beam apparatus, and in particular electron beam apparatus which comprises a photocathode. The present invention also relates to a corresponding method for preparing a specimen for inspection.

DESCRIPTION OF RELATED ART

Electron microscopy is a technique that uses an electron beam to illuminate a specimen and produce a magnified image. It utilizes an electron gun to generate the electron beam and electrostatic or electromagnetic lenses to focus the electron beam and form the image. Because the wavelength of high-energy electrons is orders of magnitude shorter than the wavelength of light, electron microscopy can achieve greater resolving power than light-powered optical microscopes.

The major types of electron microscopes are the transmission electron microscopes (TEM) and the scanning electron microscope (SEM).

A transmission electron microscope is a type of electron microscope, in which a beam of electrons is transmitted through a specimen. Depending on the density of the material present, some of the electrons are scattered. The electron beam is magnified and an image is formed on fluorescence screen, which gives rise to a "shadow image" of the specimen with its different parts displayed in varied darkness according to their density.

A scanning electron microscope is a type of electron microscope that images a sample by scanning it with an electron beam probe. The electrons interact with the specimen and produce a signal that gives information about its properties. Different types of signals can be collected, such as secondary electrons, back-scattered electrons, X-rays, light (cathodoluminescence), electron beam induced current, transmitted electrons and more. A map of the specimen can be produced by recording one or more type of signal for different excitation points.

In the past, the predominant electron sources in use in electron microscopes were the thermionic emission type cathodes. In such sources, a material is heated to a high temperature and its electrons gain sufficient energy to overcome the material's work function to be emitted. Common thermionic sources are tungsten wire (operating temperature ~2,400K), lanthanum hexaboride—$LaB_6$ (~1,750 K), or tungsten impregnated with work-function-lowering additives such as barium oxide (~1,000 K). Thermionic sources produce electron beams with a relatively broad energy spread (~1 eV), large source diameter (>10 µm) and low brightness ($10^6$-$10^7$ $Acm^{-2} \cdot str^{-1}$). Many demagnification stages and crossovers are necessary in order to reach small beam spots.

Because of these drawbacks, new electron microscope usually favor point cathode emitters. A point cathode electron source (Müller emitters or field emission source) is made of a sharp point held at several kilovolts negative potential relatively to a nearby electrode, so that there is sufficient potential gradient at the surface to cause field electron emission. The apex of the emitter is rounded and has a sub-micrometer radius; electrons are emitted from a surface of the apex and follow a trajectory, so that they asymptotically seem to come from a region at the back of the apex surface called the virtual source size.

Two main categories of point cathode electron source types can be found in current electron microscopes: (i) cold field emission and (ii) thermally assisted field emission cathodes.

The thermally assisted field emitter combines heat (~1,800 K), low work function (tungsten built-up emitter or tungsten with zirconium dioxide coating Schottky emitter), and a moderate applied electric field to create a stable electron source (apex radius 500 nm). Today, this is the preferred source for use in electron optical applications such as electron microscopy. It emits an electron beam with reasonable energy spreads (0.3-1.0 eV), more coherence and with up to three orders of magnitude greater current density or brightness than thermionic electron emitters. Consequently, it significantly improves signal-to-noise ratio and spatial resolution, and greatly increases emitter lifetime and reliability.

In the cold field emission source, a material is subjected to a high electric field (typically a few volts per nanometer) which substantially narrows its electron potential barrier to vacuum. The electrons in the material can then quantum mechanically tunnel through this thinned barrier and be emitted. Typically, metals such as tungsten and molybdenum are used as cold field emission sources. It is immediately apparent that a cold field emitter could be more power-efficient than a thermionic emitter which requires heating. Cold field emission sources also offer several attractive characteristics such as instantaneous response to electric field variation, resistance to temperature fluctuation, and high degree of focusability in electron optics due to their sharp (0.2-0.3 eV) energy spread. However, due to the high electric field experienced at the apexes of the materials during field emission, the metal atoms often diffuse or electromigrate, causing failure and thermal runaway. Moreover, ultra-high gun vacuum is a stringent requirement; even at $10^{-11}$ mbar, the adhesion of molecules on the emitter apex (100 nm diameter) results in flickering of the emission current (4-6% RMS).

Photoelectron sources are much less common, but can potentially combine most advantage of cold field emitters and thermally assisted field emitters. In a photoelectric source, a photon beam irradiates the surface of the emitter with an energy higher than its work function and electrons are extracted through the photoelectric effect. These sources have an energy spread similar to or smaller than cold emitters (0.1-0.3 eV). They have a larger surface area than cold emitters and hence are less sensitive to adhesion of molecules on their apex than conventional cold field emitters.

Electron microscopes produce macroscopic electromagnetic fields, thanks to macroscopic elements, such as solenoids, magnetic multipoles, or by voltages applied to conducting devices. Electromagnetic fields form an inhomogenous and anisotropic medium of refraction for charged particles. In close analogy to light optics, the description of the propagation of electrons within these fields is described by so called geometrical electron optics, where the path of an electron is conceived as a geometrical line or trajectory and refracted by gradient-index lenses (because electron optical elements generate electromagnetic fields which vary continuously). The effects of diffraction on the motion of electrons is negligibly small because the fields do not change appreciatively over a distance of several wavelengths of the propagating electrons. So is the effect of spin which is of the same order of magnitude as diffraction.

In practice, the calculation of electron trajectories in the most general case is very involved and exhibit chaotic behavior in many cases. If the electron beam is confined to the vicinity of the center of the electron optical elements (i.e. if the electron beam diameter stays approximately smaller than one fifth of the diameter of the inner faces of the electron optical elements), paraxial conditions prevail: elements being used for manipulating an electron beam, such as focusing and deflecting, have dominant effects that can be characterized by means of a small number of quantities and are perturbed by minor effects likewise capable of simple characterization. For most electron optical elements (round and quadrupole lenses and magnetic and electrostatic deflecting elements) the dominant effect is linear and the quantities that characterize it are the familiar cardinal elements of Gaussian optics: focal lengths, positions of foci, principal planes and nodal planes.

Perturbations to those dominant effects are geometric aberrations, which measure any departure from the linear behavior. They are characterized by aberration coefficients. For instance, it is known that a cylindrically symmetric electromagnetic lens is always plagued by so called spherical aberrations, i.e. the focal point for electrons travelling along the axis of symmetry is not the same as for electrons travelling parallel to the axis at a given distance.

All electron gun and electron optics suffer from aberrations so that the resolving power of an electron microscopes is usually not limited by the diffraction limit but by aberrations and distortions of each lens. Therefore the image of the virtual source which is obtained at the surface of a specimen is, for some applications, not small enough to provide for sufficient resolution of inspection of the specimen. Electron microscope manufacturers have devised schemes to minimize such aberrations by improving the electron optical design. Recently, aberration corrected electron microscopes have been developed. Such microscopes can correct part of the aberrations but are extremely complicated and onerous.

It has been demonstrated that facetted electron emitters could increase the size of the virtual source compared to a spherical emitter and have a negative impact on the electron beam spot size on the specimen. Yet, it has not been shown how the shape of such an emitter could be used to achieve the opposite effect: reduce the size of the electron beam spot size on the specimen.

From U.S. Pat. No. 4,829,927 there is known a photocathode based scanning electron beam apparatus. The size and shape of the emitting area of the photocathode can be selected so that the desired spot size and shape can be projected for all system needs. Electrons emitted from one point of the photocathode are parabolic. The asymptotes of these parabolas intersect in a virtual cathode plane, which means that the invention requires a planar photocathode to work. The virtual cathode plane is imaged into a first spot-shaping aperture thanks to an electrostatic lens and forms a crossover. The image at the crossover is imaged again onto a specimen by an electron optical focusing and deflecting system. While the invention considers the possibility to modify the emitting area to achieve the desired spot size on the specimen, it does not disclose how to shape the photocathode itself to obtain a smaller spot size. It does not disclose either how to modify the shape of the virtual source in order to minimize the size of the electron spot on the specimen. Nor does it disclose an electron optical scheme that works without any intermediate crossover.

From U.S. Pat. No. 4,868,380 there is known an optical waveguide photocathode for converting optical signals to electrical signal, having an optical waveguide, a semiconductor covering the end of the optical waveguide, a first electrode to connect the semiconductor to an electric circuit and a second electrode disposed adjacent to and spaced from the semiconductor. The waveguide, first conductor and semiconductor are relatively curved or pointed at the end. As a result, high electric fields are generated at the apex for any given voltage between the electrodes. This allows for a much greater efficiency in converting light to electrons. The document neither discloses how to shape the emitted electrons into an electron beam, nor how to focus the electron beam on a specimen.

From U.S. Pat. No. 5,041,724 there is known an improvement to photocathode based electron beam devices, wherein the energy of the photon beam irradiating the photocathode has an energy smaller than the work function of the cathode material. The work function of the cathode is reduced with an external field to such an extent that photoemission occurs, but not field emission. It is also disclosed how photoelectrons can be focused on a specimen and a secondary electron signal detected. Yet, it is not known from the document how the virtual source of the photocathode can be imaged or how the size of the electron beam spot on the specimen could be minimized.

From U.S. Pat. No. 5,270,643, it is known a photoelectron scanning electron microscope for noncontact testing of integrated circuits. In this invention a picosecond laser beam is used to drive a photocathode, which generates a photoelectron beam, which in turn is focused on a specimen by an electron-beam column. The document does not disclose that a virtual electron source may be imaged onto a specimen, neither does it disclose how a photocathode could be shaped to minimize the electron beam spot size on the specimen.

Similarly to U.S. Pat. No. 5,270,643, an electron beam measuring device is know from Appl. Phys. Lett. 51 (1987), pages 145 to 147 in which the conventional thermionic electron source of an scanning electron microscope was replace by an optically driven photocathode; the ultraviolet pulses of a laser beam (100 MHz pulse repetition rate, 1.5 ps pulse width, 2 mW average power and 266 nm wavelength) were focused on a roughened thin-film gold photocathode evaporated on a planar quartz substrate mounted at the head of the SEM column. In a typical mode of operation, a photocurrent of 10 nA was generated from a 4 μm spot size at the cathode, however, only 25 pA reached the sample as the electron beam went through a series of demagnification optics and pinholes. Moreover electron beam crossovers were responsible for strong space charge effects yielding a loss in spatial (0.1 μm) and temporal resolution (5 ps). It is not disclosed in this document how the size of the electron beam spot on the specimen could be minimized.

From EP 0 834 89 A1, there is known an apparatus for generating a photoelectron beam with a optical waveguide, a metal carbide coating to the end of the optical waveguide in order to generate electrons, as well as a field-generating means in order to lower the electron work function of the coating so far that a photoemission current can be generated. It is not disclosed how a virtual source could be imaged onto the specimen, neither is it disclosed how the electron beam spot on the specimen could be minimized.

It is known from Microelectronic Engineering 57-58 (2001), pages 155-161 a field emission photocathode array, made from p-doped silicon. The virtual source size of each emitter (~10 nm) is imaged on a specimen. Each image is made at a different point and the document does not disclose how the size of the image on the specimen could be reduced.

U.S. Pat. No. 5,895,919, discloses an electron gun lens for generating a particle beam with a cathode, an extraction electrode, an anode and a condenser lens, wherein a deceleration field is generated between the extraction electrode and the anode and the condenser lens produces a magnetic field which is superimposed on both the cathode, the extraction electrode and the anode. The cathode may be a photocathode and the virtual source of the cathode may be imaged onto a specimen; however there is no disclosure of how the electron beam spot on the specimen could be minimized.

U.S. Pat. No. 6,215,128 (2001) & U.S. Pat. No. 7,161,162 (2007) disclose methods to form an optical image on a photocathode, convert the optical image into an electron emission pattern and image the photocathode onto a specimen. The documents do not address how the electron beam spot on the specimen could be minimized.

It should be noted that minimizing the spot size or beam spot size means minimizing the size of the image of the virtual source on the specimen.

US2010/0127170 discloses a Schottky field emitter having a large conical end. Its protrusion length and tip radius can be controlled so that the electron density of the emitted photoelectron can be minimized. The invention does not disclose how this could be applied to a photoelectron emitter instead of a field emitter and does not disclose how to minimize the image of the virtual source onto a specimen.

It is clear that none of the prior art documents address the issue of minimizing beam spot size; in each of the prior art documents the spot size is too large to achieve a high resolution inspection of the specimen.

It is an aim of the present invention to mitigate some of the aforementioned disadvantages.

BRIEF SUMMARY OF THE INVENTION

The present invention provides a new electron optical method that comprises the steps of engineering the shape of the virtual source of a point photocathode and imaging said virtual source onto a specimen.

When the photocathode is irradiated electrons are emitted from a surface of a cathode; the emitted electrons each follow a trajectory. The trajectory of each electron can be extrapolated back to a region within the cathode (region of minimum confusion). Thus according to the trajectory of the electrons, the emitted electrons appear to be emitted from a region within the cathode; the region is defined by the volume of the cathode in which the extrapolated trajectories of the electrons intersect; this region may be referred to as the region of minimum confusion. Because of their trajectories the electrons appear to be emitted from this region of minimum confusion within the cathode. However, there is in fact no electron source present at the region of minimum confusion, thus the region of cathode where the trajectories of the electrons intersect (i.e. the region of minimum confusion) is known as a 'virtual source'. The virtual source is thus a region within the cathode where the extrapolated trajectories of the electrons intersect.

The emitted electrons may be focused onto a specimen. The emitted electrons may be focused to a region on a specimen. The region at which the electrons are focused is known as the image of the virtual source. The size of the image of the virtual source is related to the size of the virtual source. Preferably, the size of the image of the virtual source is proportional to the size of the virtual source. The image of the virtual source can also be referred to as the spot size.

An electron beam apparatus built for the implementation of this method may feature from micrometer to sub-nanometer spot size, simple electron optical design and lower production costs. It may be operated with high electron density beams or ultrafast electron pulses without significantly degrading the featured spot size.

A method suitable for preparing a specimen for inspection, the method comprising the steps of:
irradiating a photocathode so that the photocathode emits electrons from a surface of the photocathode, wherein the photocathode comprises a rounded tip which has a radius of curvature;
configuring the emitted electrons so that they form an electron beam, wherein the emitted electrons forming the electron beam each follow a trajectory, and the trajectories of the emitted electrons are such that they can be extrapolated to intersect at a region within the photocathode, the region defining a virtual source, and;
focusing the electron beam onto a specimen to form an image of a virtual source on the specimen.

The method may also be used for preparing a specimen for inspection, electron lithography, or focused electron beam induced processing, such as focused electron beam induced deposition (a process of decomposing gaseous molecules by electron beam leading to deposition of non-volatile fragments onto a nearby specimen) or focused electron beam induced etching (a process of decomposing gaseous molecules by electron beam leading to etching of a nearby specimen).

Preferably the method is a method of preparing the specimen for inspection and the step of focusing the electron beam onto a specimen to form an image of a virtual source on the specimen is done so that the specimen is prepared for inspection. The method is a method of preparing a specimen for inspection, the method comprising the steps of: irradiating a photocathode so that the photocathode emits electrons from a surface of the photocathode, wherein the photocathode comprises a rounded tip which has a radius of curvature; configuring the emitted electrons so that they form an electron beam, wherein the emitted electrons forming the electron beam each follow a trajectory, and the trajectories of the emitted electrons are such that they can be extrapolated to intersect at a region within the photocathode, the region defining a virtual source, and; focusing the electron beam onto a specimen to form an image of a virtual source on the specimen so that the specimen is prepared for inspection.

For curved surfaces, the radius of curvature at a given point is the radius of a circle that mathematically best fits the curve at that point. At each point on a given two-dimensional surface, there are two "principal" radii of curvuture. The larger is denoted $R_1$, and the smaller $R_2$. The "principal directions" corresponding to the principal radii of curvature are perpendicular to one another. In other words, the surface normal planes at the point and in the principal directions are perpendicular to one another, and both are perpendicular to the surface tangent plane at the point. The radius of curvature of the photocathode tip is defined for a given point at its surface and is equal to one of the principal radii. Preferably, the photocathode tip is cylindrically symmetric (i.e. it looks the same after any amount of rotation around an axis) so that the principal radii for said given points are equal. Preferably, the photocathode tip is cylindrically symmetric and said given point is positioned on the axis of symmetry.

Providing the photocathode with a radius of curvature reduces the size of the virtual source and thus a smaller image of the virtual source is achievable; this provides for a higher resolution of inspection.

The region may be a volume of the photocathode not greater than 1,000,000 $nm^3$. The region is preferably a volume of the photocathode between 1 $nm^3$-1,000 $nm^3$. The region is more preferably a 1,000 $nm^3$ volume of the photocathode.

The region may be a point within the photocathode. The trajectory of each electron maybe such that it can be extrapolated to intersect at a point within the photocathode, that point defining a virtual source.

The trajectory of each electron is such that it can be extrapolated to intersect a surface of the photocathode, the surface of intersection defining a virtual source.

The photocathode may comprise a rounded tip which has a radius of curvature so that a reduction in the size of the virtual source image can be achieved.

The rounded tip of the photocathode may have a radius of curvature in the range greater than 0.01 µm and less than infinity, wherein an infinite radius of curvature means a flat photocathode. Preferably, the rounded tip has a radius of curvature in the range 1-50 µm. More preferably the rounded tip has a radius of curvature of less than 10 µm. Most preferably the rounded tip has a radius of curvature of 2 µm.

The present invention offers the following advantages:
Simple, low cost and high spatial resolution electron beam apparatus.
Electron beam system employing a photocathode-based electron gun to produce an electron beam with a low dispersion in energy and consequently having a small virtual source.
Electron beam system with no crossovers to minimize:
Coulomb interaction between electrons (space charge effect), hence improving spatial and temporal resolution,
electron losses in the electron optics, hence improving signal over noise ratio.
Electron beam system in which the virtual source can be imaged on the sample. The image can be magnified or demagnified.
By driving the photoelectron gun with an ultrafast light source, ultrafast electron pulses can be generated without degrading the probe size and probe stability on the specimen.

The step of irradiating the photocathode may comprise irradiating the photocathode with photons, so that when an electron within the photocathode absorbs a photon, the electron overcomes the work function of the photocathode material. This process is called photoelectron emission. The work function is the minimum energy that must be given to an electron at the Fermi level to liberate it from the surface of a particular substance. If the photon's energy is greater than the substance's work function, photoelectric emission occurs and the electron is liberated from the surface. Excess photon energy results in a liberated electron with non-zero kinetic energy.

The step of configuring the emitted electrons into an electron beam may comprise applying an electric field (extraction field) between the photocathode and an anode, so that electrons emitted at the photocathode are accelerated. Preferably the photocathode and anode are arranged so that the electric field can cooperate with the emitted electrons. Preferably the electric field is of a magnitude which will provide the electrons with kinetic energy proportional to the difference of potential between the photocathode and the anode.

The step of applying an electric field between the photocathode and an anode might detrimentally allow electrons to tunnel through the surface potential barrier (i.e. the potential barrier that prevents electrons from leaking out of the photocathode material) and to be emitted without having to absorb a photon first. This process, known as field emission, is not desirable as it leads to a broader electron energy dispersion of emitted electrons, larger virtual source and higher achromatic aberrations than when electrons are emitted by photoelectron emission. As such, the electrical field gradient at the photocathode tip may be caped in order to limit the proportion of electrons emitted by field emission. Decreasing field emission can be achieved by increasing the radius of curvature of the electron source and/or by limiting the electric field applied between the photocathode and the anode. Preferably, the proportion of electron emitted by field emission represents at most one percent of the electrons emitted by photoelectron emission. Most preferably, the proportion of the electron emitted by field emission represents at most 0.01% of the electrons emitted by photoelectron emission.

Preferably, the energy of the photons irradiating the photocathode is between or equal to, the energy necessary to overcome the work function of the photocathode material and the energy necessary to overcome the work function plus 1 eV. This should ensure that the kinetic energy of each emitted electron is smaller than 1 eV plus a contribution due to the initial energy level of the electron within the photocathode material before its excitation. Preferably the energy of the photons irradiating the photocathode is between or equal to, the energy necessary to overcome the work function of the photocathode material and the energy necessary to overcome the work function plus 0.1 eV. The energy of the photons irradiating the photocathode may also be up to 1 eV (preferably 0.05 eV) smaller than the energy necessary to overcome the workfunction of the photocathode material, so that only electrons filling the highest energy levels of the photocathode are emitted. This ensures that the electron beam has a small chromatic dispersion, i.e. that each electron within the electron beam has a similar kinetic energy, and concurs to reduce chromatic aberrations of the focusing system. The step of applying an electric field between the photocathode and an anode may also contribute to reduce the photon energy necessary to emit electrons from a surface of the photocathode as an electron could acquire enough energy from a photon to have a significant probability to tunnel through a surface potential of the photocathode material even if the photon energy is smaller than the energy of the work function. In the event an electron has a kinetic energy higher than zero when it is emitted, its momentum is non-zero and may have an arbitrary direction having a radial component (orthogonal to the surface) and a transverse component (tangential to the surface). The part of the kinetic energy carried out by the radial and transverse momentum are respectively called radial and transverse kinetic energy.

Preferably, the intensity of the extraction field is configured to minimize field emission, to ensure the electrons are extracted from the photocathode surface and to ensure that the electrons have minimal amount of time to interact through Coulomb interactions. Preferably, the intensity of the extraction field is capped so that field emission is negligible (for example 1% of the total emission current or 0.01% might be considered negligible), yet it is not lowered further so that the electrons are quickly extracted from the photocathode surface and have minimal time to interact through Coulomb interactions. Indeed, electron-electron interactions, yield to a degradation of the quality of the electron beam and should be minimized.

Preferably, the photocathode and the extraction field are cylindrically symmetric around an optical axis, so that the electron beam is cylindrically symmetric around the optical axis. Preferably, the photocathode has a cone shape with a rounded apex. The cone shape may have an apex angle in the range 0° to 180°. Preferably, the cone shape has an apex angle in the range 25° to 40°, so that after a distance of between 5-100 times the radius of curvature of the photocathode tip, the transverse kinetic energy is converted to radial kinetic energy and inhomogeneity of the extraction field due to the geometric design of the photocathode vanishes; and electrons travel in straight lines. Preferably, the cone shape has an apex angle in the range 25° to 40°, so that after a distance of 10 times the radius of curvature of the photocathode tip, the transverse kinetic energy is largely converted to radial kinetic energy and inhomogeneity of the extraction field due to the specific geometric design of the photocathode vanishes; and electrons travel in straight lines. These trajectories of the electrons emitted from the photocathode may be projected back to intersect at region within the photocathode, that region defining the region of minimum confusion, i.e. the virtual source. While the region of minimum confusion can be arbitrarily chosen it is preferably chosen so that it has the smallest possible area. The virtual source may not be punctual because of the kinetic energy and aberrations inherent to the structure of the electric field around the photocathode, thus the virtual source may be defined by a region within the photocathode i.e. the trajectories of the electrons emitted from the photocathode may be extrapolated back to intersect at a 'region', rather than a single 'point', within the photocathode.

Preferably, the trajectories of the electron emitted from the photocathode are extrapolated to intersect at a region within the photocathode, the region defining a virtual source, once electrons have gained the energy given by the difference of potential between the photocathode and the anode. If an electron reaches said energy at a point P, the tangent to the trajectory of this electron at point P is used to extrapolate linearly the electron trajectory to the virtual source. It is "as if" the electron had travelled linearly from the virtual source to point P.

The method may further comprise the step of optimizing the shape of the photocathode so that the size of the virtual source is minimized.

The method may further comprise the step of optimizing the shape of the photocathode so that the size of the image of the virtual source on the specimen is minimized The optimization step may comprise the step of providing the photocathode with a new geometry. The optimization step may comprise the step of changing the geometry of the photocathode. The optimization step may comprise the step of providing the anode with a new geometry. The optimization step may comprise the step of changing the geometry of the anode.

The step of changing the geometry of the photocathode and/or the anode may modify the trajectories of the electrons so that they yield a smaller virtual source size and/or a smaller virtual source size image.

The step of changing the geometry of the photocathode and/or the anode may modify the trajectories of the electrons so that their yield a virtual source size and/or a virtual source image with a given shape. For example, some applications may require an elongated virtual source image on the specimen.

The optimization step may comprise the steps of,
changing the geometry of the photocathode;
calculating the electromagnetic fields in between the photocathode and the anode;
ray tracing the electron trajectories as a function of their initial momentum at emission;
projecting back all electron trajectories so that the virtual source can be defined;
iterating over one or more previous optimization steps until the required virtual source size or the required virtual image size is obtained.

The optimization step may comprise the step of changing the extraction potential.

The optimization step may comprise the step of calculating electron-electron interactions.

A step of providing a photocathode with a new geometry, may comprise providing a photocathode which has a different apex angle or tip radius. The step of changing the geometry of the photocathode, may comprise changing the apex angle or tip radius of the photocathode. Preferably, the electromagnetic field is calculated numerically for a selected mesh of points.

Electron-electron interactions concur to degradation of the optical properties of the overall electron beam system and should be avoided. Electron-electron interactions might be further reduced by choosing a photocathode geometry, such that it has a large electron emission surface (large point cathode radius). Yet the radius should be small enough so that the energy spread of the electron beam does not degrades significantly the size of the virtual source.

The step of irradiating the photocathode may comprise irradiating the photocathode with photons which have half of the energy necessary to overcome a work function of the photocathode material, so that the electron emission process is achieved through a non-linear emission process wherein for each one electron which is emitted from the photocathode at least two photons are absorbed.

The step of focusing the electron beam onto a specimen may comprise accelerating/decelerating the electron beam to a different electron beam energy.

The step of focusing the electron beam onto a specimen may comprise, selecting a portion of the electron beam to be focused on the specimen. This may be done, to example, to reduce the contribution of off-axis aberrations or reduce the electron beam current.

The step of focusing the electron beam onto a specimen may comprise arranging one or more deflectors so that they cooperate with the electron beam. The one or more deflectors may be arranged so that they correct the electron beam axis so that it passes through a center of other electron optical elements. The one or more deflectors may be arranged so that they adjust the electron beam axis so that it passes through different position of the specimen under investigation.

The step of focusing the electron beam onto a specimen may comprise using one or more stigmators to correct astigmatism of the beam.

The step of focusing the electron beam onto a specimen may comprise arranging one or more electron optical lenses so that the electron beam divergence/convergence can be modified, its pupil controlled and/or its focusing position adjusted.

The focusing step may be carried out in such away to avoid the formation of intermediary images, i.e. the electron beam trajectories within the beam do no cross each other before the specimen. The focusing step may be carried out in such away to prevent cross-over of the electron beam trajectories within the beam. This may be achieved by passing the electron beam through an electron lens which has a focal length necessary to prevent the cross-over of the electron beam trajectories before the electron beam reaches the specimen. This might be achieved by adjusting the focal lens of one electron lens so that there is no cross-over of the beam before it reaches the specimen. A plurality of lenses may be provided; preferably only the focal lens which is immediately before the specimen (i.e. the last focal lens through which the electron beam passes before reaching the specimen) may be adjusted to focus the electron beam onto the specimen. Suppressing intermediary crossovers, i.e. keeping away electrons from each other during their time-of-flight between the photocathode and specimen, concurs to reduce electron-electron interactions. Alternatively the focusing step may be carried out in such a way to enable a single cross-over of the electron beam trajectories within the beam before the beam reaches the specimen; this may be achieved using one or more electron lenses, each lens having the appropriate focal length.

Electron optical elements suffer from strong off axis aberration. Therefore, in most electron beam apparatuses, the electron beam diameter goes through the center of electron optical elements and the electron beam radius is kept as small as possible. This means that electrons emitted from the photocathode apex, along the optical axis will suffer the least aberrations. The further electrons are emitted from the optical axis, the stronger they will be subject to aberrations. In other words, electrons emitted at a distance r1 from the axis will suffer from less aberrations than electrons emitted at distance r2 from the axis, provided r2>r1. Off-axis aberration will modify the focal point of the electron beam on the specimen.

A known solution is to block electrons emitted far away from the axis by sending the electron beam through a hole for instance. Yet, this is far from ideal since it contributes to decreasing the electron beam current. In this invention, the virtual source position of electrons emitted at the distance r of the optical axis is changed so that the electron beam is focused at the same position than for an electron beam emitted along the optical axis.

Consequently, the method according to the present invention may further comprise the step of, irradiating a photocathode so that the photocathode further emits electrons from at least a second portion of the photocathode which has dimensions different to the dimensions of the rounded tip, wherein the second portion is configured such that electrons emitted from the second portion each follow a trajectory, and the trajectories of the electrons are such that they can be extrapolated to intersect at a second region within the photocathode, the second region defining a second virtual source, wherein the first and second virtual sources are positioned such that images of the first and second virtual sources are located at the same position on the specimen.

The first and at least second virtual sources may also be positioned such that images of the first and at least second virtual sources are located within a selected region of the specimen. This may be done so that a selected region of the specimen is illuminated. For example, a narrow elongated region might be chosen so that high resolution is achieved along one axis and a broad region is irradiated along the other axis. The region may be selected so that each of the plurality of virtual sources are located on the specimen so as to achieve a reduction in the size of the virtual source image. Preferably the images of each of the plurality of virtual sources are located at the same position on the specimen so as to achieve a reduction in the size of the virtual source image.

The first and at least second virtual sources may also be positioned such that images of the first and at least second virtual sources are located within a selected region of the specimen and such that the electron irradiation density within the region is controlled. For example, the images position of the virtual sources might be chosen such that the irradiation profile of the given region is gaussian.

The method may further comprise the step of optimizing the shape of the photocathode so that the first and second virtual source are minimized so as to minimize the spot size and/or their position is optimized so that they are imaged on the same point of the specimen. The optimization step may comprise the step of changing the geometry of the photocathode. The optimization step may comprise the step of providing the photocathode with a new geometry. The optimization step may further comprise the step of changing the geometry of the anode. The optimization step may further comprise the step of providing the anode with a new geometry.

The optimization step may comprise the steps of,
changing the geometry of the photocathode;
calculating the electromagnetic fields in between the photocathode and the specimen;
ray tracing the electron trajectories as a function of their momentum from the photocathode to the specimen;
calculate the size of the electron beam spot on the specimen;
iterating over one or more previous optimization steps until the minimum spot size is obtained on the specimen.

Aberrations may also originate from mechanical or other imperfections from the electron optical elements: round lenses are never perfectly round, magnetic materials perfectly homogeneous, alignment perfectly exact. Those parasitic aberrations will be different for each optical element. Yet they may also be corrected by the method already described. As such the shape of the photocathode may not be limited to cylindrical symmetry but may have any arbitrary shape. Astigmatism could thus be corrected. As such, the photocathode may comprise a rounded tip which has two principal radius of curvature at a given point, so that the virtual source position may differ whether the electrons are propagating within one principal plane or the other.

This method may be used to correct any kind of geometric aberrations, such as spherical aberrations, as opposed to chromatic aberrations.

The step of irradiating the photocathode might be performed by irradiating the photocathode with circularly polarized light, so that the emitted electron beam is spin polarized, i.e the population of electrons emitted with one given spin is different from the population of electrons emitted with an opposite spin.

The method may comprise the step of controlling the angular span of the electron beam. This may be achieved by directing the electron beam towards an aperture, so that only part of the electron beam is conserved. Thus, only selected electrons may be conserved. For example, only electrons emitted from a selected region of the photocathode surface may be conserved. The selected region of the photocathode may be a region of the photocathode which has been engineered to compensate for electron optical aberrations.

The method may further comprise the step of measuring the electrons transmitted through the specimen.

The method may further comprise the step of adding lenses and a detector at the back of the specimen to make an image of the illuminated specimen.

The method may comprise the step of measuring signals which comprise at least one of secondary electrons, backscattered electrons, transmitted electrons, X-rays and/or light (cathodoluminescence). Preferably the method comprises the step of resolved temporally a measured signal.

According to a further aspect of the present invention there is provided, a method of preparing a specimen for inspection, the method comprising the steps of: irradiating a photocathode so that the photocathode emits electrons, wherein the emitted electrons follow a trajectory as they are emitted from the photocathode so that the emitted electrons appear to be emitted asymptotically from a virtual source; configuring the emitted electrons so that they form an electron beam; focusing the electron beam onto a specimen to form an image of the virtual source on the specimen so that the specimen is prepared for inspection.

According to a further aspect of the present invention there is provided a electron beam apparatus comprising: an emitter which is operable to emit electrons, wherein the emitted electrons each follow a trajectory, and the trajectory of each electron is such that they can be extrapolated to intersect at a region within the emitter, the region defining a virtual source; a means for configuring the emitted electrons into an electron beam; a means for focusing the electron beam onto a specimen so that an image of the virtual source can be formed on the specimen, and wherein the emitter comprises a rounded tip which has a radius of curvature, so that the size of the virtual source is reduced and thus a smaller image of the virtual source is achievable According to a further aspect of the present invention there is provided an electron beam apparatus comprising: a photocathode; a means for irradiating said photocathode so that the photocathode will emit electrons, wherein the emitted electrons will follow a trajectory as they are emitted from the photocathode so that the emitted electrons will appear to be emitted radially from a virtual source; a means for configuring the emitted electrons into an electron beam; a means for focusing the electron beam onto a specimen so that an image of the virtual source can be formed on the specimen.

According to a further aspect of the present invention there is provided an electron beam apparatus comprising: a photocathode; a means for irradiating said photocathode so that the photocathode will emit electrons from a surface of the photocathode, wherein the trajectory of an electron is such that it can be extrapolated to intersect a region within the photocathode, the region defining a virtual source; a means for configuring the emitted electrons into an electron beam; a means for focusing the electron beam onto a specimen so that an image of the virtual source can be formed on the specimen and wherein the photocathode comprises a rounded tip which has a radius of curvature, so that the size of the virtual source is reduced and thus the smaller image of the virtual source is achievable The geometry of the photocathode may be such that the emitted electrons will appear to be emitted radially from a virtual source.

The tip of the cathode may be configured to be aspheric so that electrons emitted from cathode follow a plurality of different trajectories, and the trajectories of the electrons are such that they can be extrapolated to intersect at a plurality different regions within the photocathode, each of the plurality of different regions defining a plurality of virtual sources, wherein the plurality of virtual sources are positioned so as to compensate for electron optical aberrations, such that images of each of the plurality of virtual sources are located at the same position on the specimen to achieve an reduction in the size of the virtual source image.

An aspheric photocathode is such that it does not have a purely spherical shape, i.e, it cannot be described by a single radius of curvature. Preferably, an aspheric photocathode is cylindrically symmetric, so that it has a radius of curvature at its apex and a least one different radius of curvature at a different point of the photocathode surface.

The geometry of the cathode may be such that the electrons emitted from cathode follow a plurality of different trajectories, and the trajectories of the electrons are such that they can be extrapolated to intersect at a plurality different regions within the photocathode, each of the plurality of different regions defining a plurality of virtual sources, wherein the plurality of virtual sources are positioned so as to compensate for electron optical aberrations, such that images of each of the plurality of virtual sources are located at the same position on the specimen to achieve a reduction in the size of the virtual source image.

The cathode is preferably a photocathode.

The surface of the photocathode may be patterned in such a way that irradiating the photocathode excites surface plasmons on the photocathode. Preferably, the photocathode surface is patterned in such a way that the surface plasmons are excited resonantly and photoelectric emission is enhanced.

The means for configuring the emitted electrons into an electron beam may comprises an extraction electrode.

The electron beam apparatus may further comprise an anode electrode for accelerating said electron beam.

The electron beam apparatus may further comprise a condenser lens for effecting convergence of said electron beam.

The condenser lens may be configurable into an active mode and a deactive mode, wherein in the active mode the convergence of the electron beam is altered and in the deactive mode the electron beam is unaltered by the condenser lens.

The condenser lens may comprise a magnetic lens.

The condenser lens may comprise an electromagnetic lens.

The photocathode may be arranged such that it is immersed within a magnetic field of a magnetic or electromagnetic lens.

The means for focusing the electron beam onto a specimen may comprise an objective lens.

The means for focusing the electron beam onto a specimen may comprise aberration correctors, such as energy filters, spherical-aberration correctors or any kind of correctors.

The objective lens may be configured to control the convergence of the electron beam.

The objective lens may comprise, an electrostatic, magnetic or electromagnetic lenses, or any combination of one or more of such lenses.

The electron beam apparatus may further comprise a means for controlling angular span of the electron beam.

The means for controlling the angular span of the electron beam may comprises a member in which an aperture is defined.

The photocathode may comprise an aspheric surface.

The photocathode may be arranged to be irradiated from a backend thereof, wherein the backend of the photocathode is an end of the photocathode which is opposite to an end from which electrons are emitted.

The photocathode may be arranged to be irradiated from a front end thereof, wherein the front end of the photocathode is an end of the photocathode from which electrons are emitted.

The photocathode may be arranged within a vacuum.

The vacuum may be between $10^{-3}$ and $10^{-12}$ mbar.

The photocathode may comprise a back illuminated waveguide.

The means for irradiating said photocathode may be configurable to provide an incident photon beam.

The incident photon beam may be configured to have an energy between 100 nm and 1 μm.

The electron beam apparatus may further comprise an electron gun.

The photocathode may be driven by a laser.

The electron beam apparatus may further comprise one or more deflectors which are configurable to deflect the beam of electrons.

The electron beam apparatus may further comprise astigmatism correctors which are arranged to correct beam astigmatism.

According to a further aspect of the present invention there is provided a scanning electron microscope comprising any one of the above mentioned electron beam apparatuses.

According to a further aspect of the present invention there is provided, use of an electron beam apparatus according to any one of the above-mentioned electron beam apparatuses to prepare a component for inspection.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS OF THE INVENTION

Figure 1A:
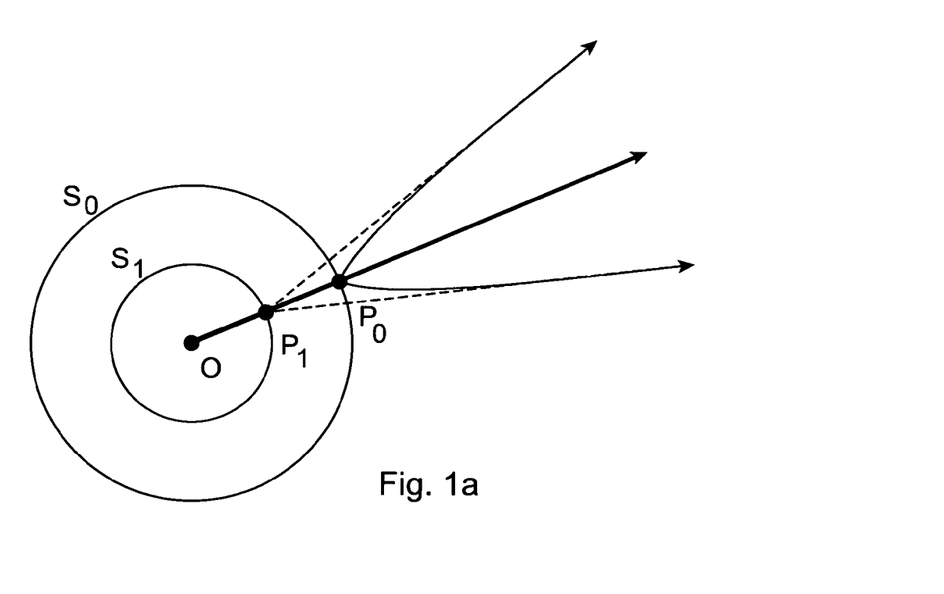
FIGS. 1a and 1b are schematic diagrams illustrating the optical behaviour of a spherical charged particle emitter.
Figure 1B:
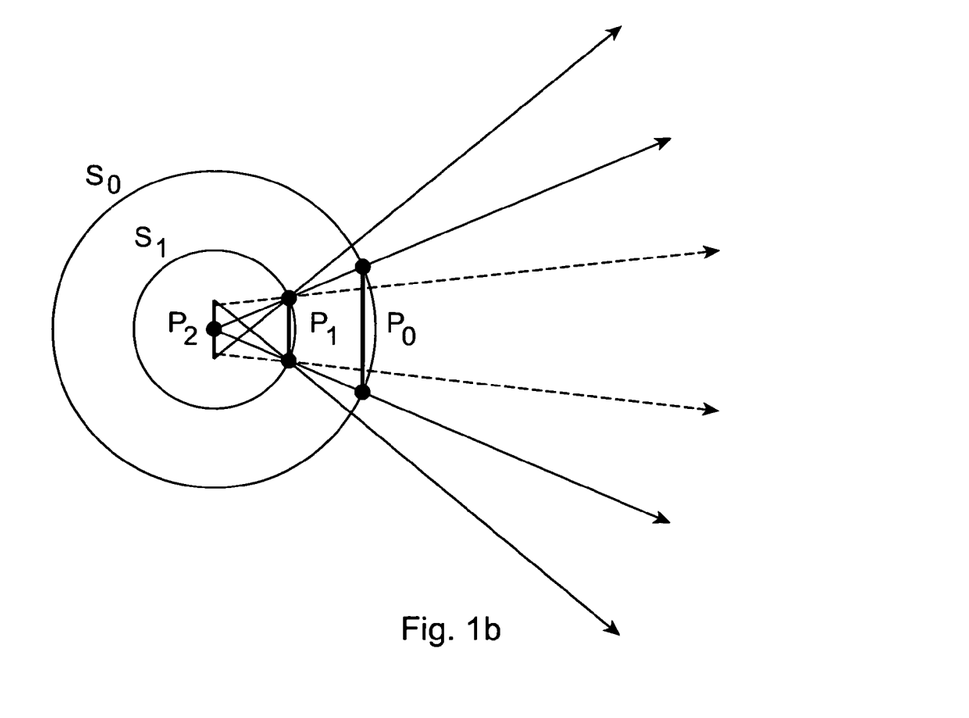
Figure 2:
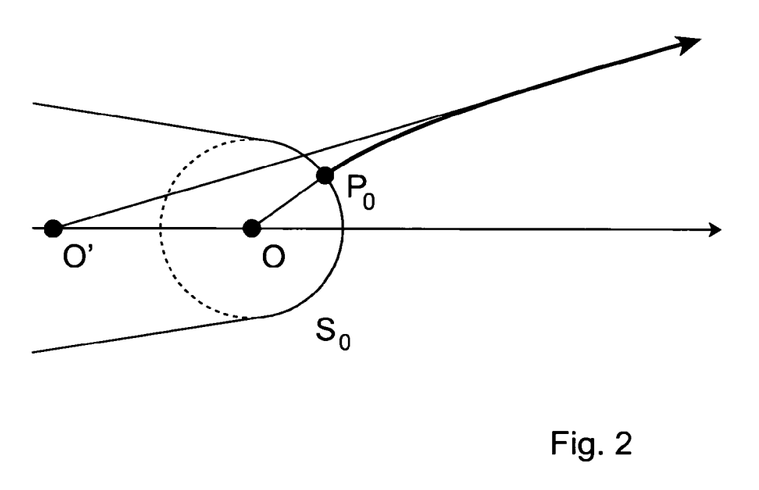
FIG. 2 is a schematic diagram illustrating the optical behaviour of a point cathode.

Referring now to FIGS. 1a, 1b and FIG. 2. FIGS. 1a and 1b are schematic diagrams illustrating the optical behaviour of a spherical charged particle emitter. Diagrams are not to scale and emission angles purposely exaggerated. In FIG. 1a the electron emitted from point $P_0$ at the surface $S_0$ of a spherical charged particle emitter are blurred into a cone-like pencil of electrons which asymptotically seems to come from point $P_1$ on sphere $S_1$ of radius $r_0/2$. In FIG. 1b There are two virtual object of minimum confusion associated with electrons emitted from fall-off radius $\rho_0$ at the surface of $S_0$: the Gaussian image of fall-of radius $\rho_1$ on sphere $S_1$ and the crossover in the vicinity of point O.

In order to understand the present invention, it is important to understand how a point source emitter works. In point cathode electron sources, the cathode is treated as a point source emitting electrons with the energy that corresponds to the acceleration voltage of the first anode. It is modelled by:

a spherical cathode of radius $r_0$ fitted to the real emitter's apex a weak electrostatic lens to take into account the effect of the cone-like shank on the extraction voltage.

Spherical Charged Particle Emitter

An electron is emitted from the real source point $P_0$ at the surface $S_0$ of a spherical charged particle emitter of radius $r_0$. If it travelled radially, the emission would appear to come from a virtual point source at the center $P_2$ of the sphere $S_0$. In reality, emitted electrons have a transverse kinetic energy, which asymptotically transforms into radial kinetic energy. After a radius of about 10 $r_0$, electrons effectively travel in straight lines. For small transverse energies, it can be shown that emitted electrons seem to emerge from a point $P_1$ on sphere $S_1$ of radius $r_0/2$.

Electrons emitted from a disc of fall-off radius $\rho_0$ at the surface of the spherical charged particle emitter $S_0$ might seem to come from one of the following virtual object of minimum confusion:

the virtual disc of fall-off radius $\rho_1$ on sphere $S_1$, commonly called Gaussian image, the virtual disc of fall-off radius $\rho_2$ in the vicinity of point O, commonly called crossover.

Weak Electrostatic Lens

Although the shank of a point cathode does not contribute to the emission of electrons, the field between the cathode and the anode electrode acts on the electron farther away from the apex. The effect can be modeled by a weak electrostatic lens. The weak lens compresses angles and reduces the lateral size of virtual objects. It also shifts the crossover point O to O'.

In this document, for a given electron gun, we call virtual source the virtual object of minimum confusion. This point is usually the crossover, but depending on the geometry of the pointed cathode and the aberrations of the electron gun and electron optics, it could also be the gaussian image or any other virtual object of interest.

FIG. 2 is a schematic diagram illustrating the optical behavior of a point cathode. The diagrams is not to scale. Electrons are emitted from the real point $P_0$ on the emitter apex. The effect of the cone-like shank is represented as the behaviour of a weak lens; it shifts the crossover point from O to O' so that the emission angle is reduced.

Embodiments of the present invention could have the following features a photoelectron gun and electron optics components.

Photoelectron Gun

The electron gun consists of a point photocathode emitter having a conical shape with a large apex radius (1 μm or more). The apex is illuminated by a photon beam (from a laser or LED) and emits photoelectrons through the photoelectric effect. The photocathode surface is either front illuminated or back-illuminated. In the case it is front-illuminated the cathode is built from bulk material and illuminated directly by using a lens for instance. In the case it is back-illuminated, the light is coupled into a conical optical waveguide, which is coated with a metal or a semiconductor.

An extraction electrode is placed at 300 μm from the apex and used to extract electrons. The extraction field has to be (1) as high as possible to extract electrons as fast as possible and avoid space charge effects which would reduce the size of the virtual source, but (2) not to high to avoid field effect and dark current, which would increase the energy dispersion and prevent the system to be optically driven. A good radius of curvature for the photocathode is 2 μm; it is too large to have field effect emission, while assuring a strong extraction field.

The large radius of curvature at the apex also reduces the impact of the adhesion of molecules commonly encountered with cold field emitters. For a given photoelectric current emission, it reduces electron-electron interactions.

The energy of the incident photons is chosen in such a way that it equals or slightly exceeds the work function of the photocathode in the presence of the electrical field. In this configuration photoelectrons have a low energy spread (0.1-0.3 eV).

An anode then accelerates the electrons.

Despite the large radius of the emitter, the virtual source of the electron gun stays small due to the small energy spread of photoelectrons (see FIG. 1).

Electron Optics

Electron optical elements image the virtual source on a plane, in such a way that no intermediary image is formed, i.e., no intermediary crossovers are formed. This configuration is very advantageous because it reduces electron-electron interactions within the electron beam and also reduces the complexity of electron optics. Such a system has only one crossover—on the focal plane—because the virtual source is solely a virtual crossover. As such, the whole system minimizes electron-electron interactions and is optimum for operation at high current. In the event the source is driven by an ultrafast light optical source, such as a femtosecond laser, the impact of electron-electron interactions within the photo-generated ultrafast electron pulses is minimized. Small diameter spot can be obtained within the focal plane.

Optimization of the Electron Gun-Electron Optics Pairing

Figure 3A:
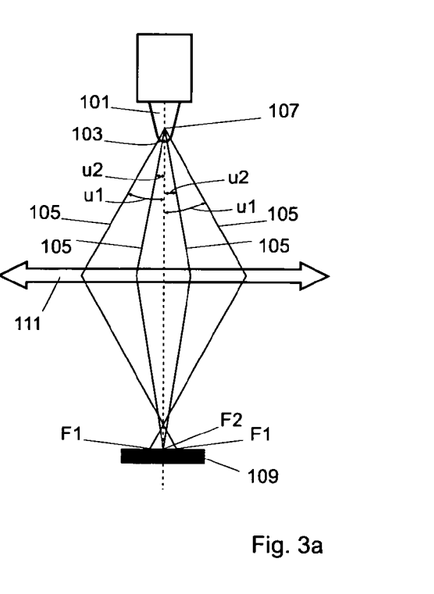
FIG. 3a illustrates the effects of spherical aberrations.

All electron gun and electron optics suffer from aberrations. FIG. 3a illustrates the effect of spherical aberrations to a beam. Electrons 105 are emitted from a cylindrically symmetric photocathode 101 having a round apex 103; the shape of the photocathode 101 and its apex ensures that the electrons 105 which are emitted from the photocathode 101 appear to be emitted from a virtual source 107. The electrons 105 proceed from the virtual source 107 under two angles u1 and u2. They are then focused on a specimen 109 by an electron optical system 111. Because of the spherical aberrations of the electron optical system 111 there is one focal point F1 for electrons emitted under angle u1 and another focal point F2 for electrons emitted under angle u2. Focal point F1 represents an image of the virtual source 107 and focal point F2 represents a second image of the virtual source 107.

Figure 3B:
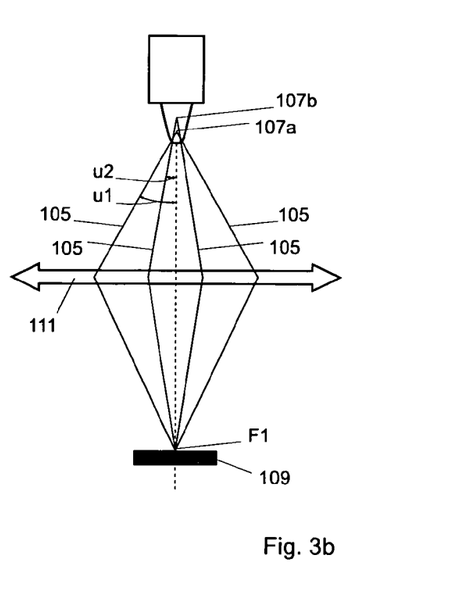
FIG. 3b illustrates the effect of modifying the photocathode shape.

As such, the optimal shape of the pointed cathode's apex might not be spherical. Slight changes to the overall geometry of the surface can modify the electron wavefront in such a way that it improves the imaging or focusing performances of the whole system. An aspheric photocathode can consequently be used to compensate for all or part of the aberrations induced by electron optical elements in the system. FIG. 3b has many of the same features as shown in FIG. 3a and like features are awarded the same reference numbers. In FIG. 3b however the shape of the photocathode 101 is modified so as to provide two virtual sources 107a,107b; a first virtual source 107a is provided from which the electrons emitted at angle u1 appear to be emitted from, and a second virtual source 107b is provided from which the electrons 105 emitted at angle u2 appear to be emitted from. The first and second virtual sources 107a,b have different positions; the different positioning of the first and second virtual sources 107a,b compensates for the spherical aberrations of the electron optical system 111 ensuring that all of the electrons 105 are focused on a single focal point F1 i.e. the images of the first virtual source 107a and the image of the second virtual source 107b overlap on the specimen.

The generation of photoelectrons from an incident excitation beam is not always very efficient and only few incoming photons may efficiently converted into photoelectrons. The shape at the surface of the photocathode can be microstructured or nanostructured in order to enhance the number of photons emitted per incoming photon. Such an enhancement can be obtained by engineering the surface so that the incident light matches a plasmonic resonance for instance.

Proposed Embodiments

Figure 4A:
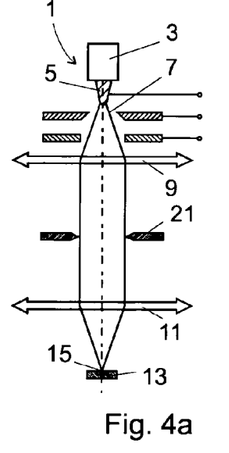
FIG. 4a is a schematic of an electron gun according to a first possible embodiment of the present invention.

Referring now to FIGS. 4a to 4f. A first embodiment of the present invention is shown in FIG. 4a. FIG. 4a shows an electron beam apparatus 1. In the embodiment shown in FIG. 4a a photoelectron gun 3 comprising a point photocathode 5 which emits an electron beam 7. Then, a condenser lens 9 collimates the electron beam 7 emitted by the photoelectron gun 3. Finally, an objective lens 11 focuses the collimated beam onto a specimen 13. In order to achieve high resolution, a plate member 21 in which an aperture is defined, is positioned before or after the objective lens 11; the plate member with aperture, decreases the angular span of the electron beam 7. The aperture diminishes the beam radius and reduces the effect of off-axis aberration that might not have been corrected by optimizing the shape of the photocathode. It thus improves the spot size 15 i.e. makes the spot size smaller. In this embodiment, very few electrons are lost and the electron beam spot 17 has size comparable to the size of the virtual source. The smaller electron beam spot size enables higher resolution images of the specimen 13 to be obtained.

Figure 4B:
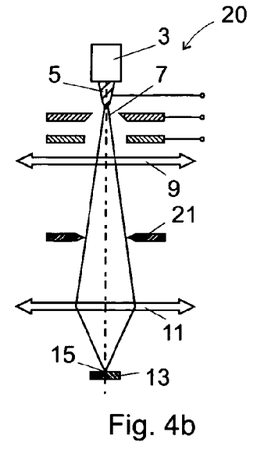
FIG. 4b is a schematic of an electron gun according to a second possible embodiment of the present invention.

A second embodiment of the present invention is shown in FIG. 4b; the electron beam apparatus 20 shown in FIG. 4b has many of the same features of the electron beam apparatus 1 shown in FIG. 1 and like features are awarded the same reference numerals. In order to achieve smaller beam spot than in the embodiment 1, the condenser lens 9 is deactivated and the objective lens 11 focusing power is increased so that it focuses the electron beam 7 and demagnifies a virtual source image (i.e. an image of the virtual source) on the specimen 13. It improves the spot size 15 i.e. makes the spot size smaller.

Figure 4C:
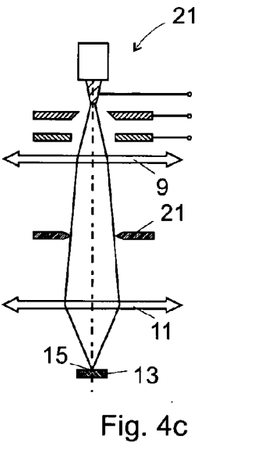
FIG. 4c is a schematic of an electron gun according to a third possible embodiment of the present invention.

A third embodiment of the present invention is shown in FIG. 4c; the electron beam apparatus 21 shown in FIG. 4c has many of the same features of the electron beam apparatus 1 shown in FIG. 1 and like features are awarded the same reference numerals. In order to achieve a smaller beam spot than in the embodiment shown in FIG. 4a, the condenser lens 9 is configured to have a reduced focus and the objective lens 11 focusing power is increased so that it focuses the electron beam 7 and demagnifies the virtual source image on the specimen 13. It improves the spot size 15 i.e. makes the spot size smaller.

Figure 4D:
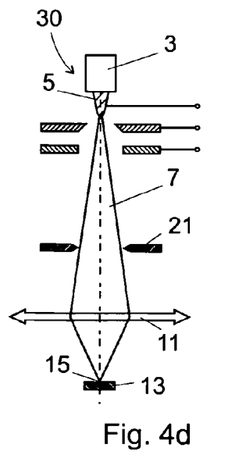
FIG. 4d is a schematic of an electron gun according to a fourth possible embodiment of the present invention.

A fourth embodiment of the present invention is shown in FIG. 4d. The electron beam apparatus 30 shown in FIG. 4d has many of the same features as described in the previous embodiments, and like features are awarded the same reference numerals. Unlike the embodiments shown in FIGS. 4b and 4c, in the embodiment shown in FIG. 4d demagnification, is achieved by removing the condenser lens 9.

Figure 4E:
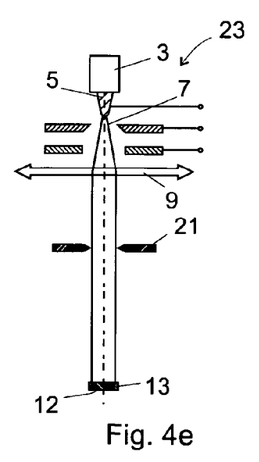
FIG. 4e is a schematic of an electron gun according to a fifth possible embodiment of the present invention.

A fifth embodiment of the present invention is shown in FIG. 4e; the electron beam apparatus 23 shown in FIG. 4e has many of the same features of the electron beam apparatuses described in the previous embodiments and like features are awarded the same reference numerals. A condenser lens 9 modifies the electron beam 7 convergence and illuminates the specimen 15. The focusing power of the condenser lens 9 can be chosen so that the electron beam 7 is focused on the specimen 15. It can also be chosen so that the electron beam 7 is defocused and a collimated electron beam 7 illuminates the sample 15. The specimen 15 can then be analysed in transmission mode by adding zero or more electromagnetic lenses and one or more detector at the back 12 of the specimen 15.

Figure 4F:
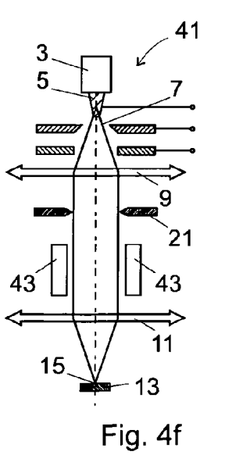
FIG. 4f is a schematic of an electron gun according to a six possible embodiment of the present invention.

A sixth embodiment of the present invention is shown in FIG. 4f. The electron beam apparatus 41 shown in FIG. 4f has many of the same features as described in the previous embodiments, and like features are awarded the same reference numerals. Unlike the other embodiments, in the electron beam apparatus 41 shown in FIG. 4f, deflecting coils 43 (or astigmatism correctors) are positioned along the path of the electron beam 7 in order to scan the electron beam 7 across the specimen 13.

In all aforementioned embodiments, it is advantageous for the condenser lens 9 to comprise magnetic lens, preferably electromagnetic condenser lens. In this case the point photocathode 5 could be located such that it is within a magnetic field of an adjacent electromagnetic condenser lens to achieve high spatial resolution.

Figure 5:
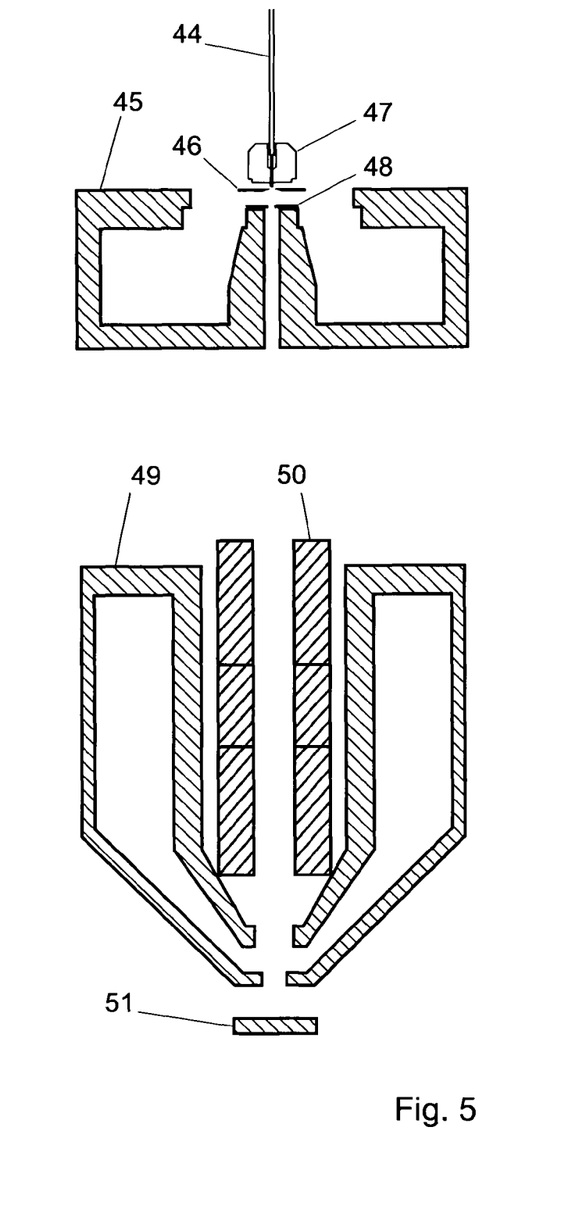
FIG. 5 is a schematic of an electron gun according to a seventh possible embodiment of the present invention.

A seventh possible embodiment of the present invention is shown in FIG. 5. FIG. 5 shows a scanning electron microscope comprising an optical fiber 44 which guides light to a point photocathode 47 that emits photoelectrons. Then an extractor plate 46 extracts these photoelectrons and an accelerator plate 48 accelerates them so that an electron beam is formed. A condenser lens 45 controls the convergence of the electron beam emitted by the photoelectron gun. Finally, an objective lens 49 focuses the collimated beam onto a specimen 51. A set of two magnetic quadrupoles and one magnetic octopole 50 is used to scan the beam over the specimen and correct for astigmatic aberrations respectively.

Various modifications and variations to the described embodiments of the invention will be apparent to those skilled in the art without departing from the scope of the invention as defined in the appended claims. Although the invention has been described in connection with specific preferred embodiments, it should be understood that the invention as claimed should not be unduly limited to such specific embodiment.

The invention claimed is:

1. A method suitable for preparing a specimen for inspection, the method comprising the steps of:
   irradiating a photocathode which is configured to be aspheric so that the photocathode emits electrons from a surface of the photocathode, wherein the emitted electrons follow a plurality of different trajectories, and the plurality of trajectories of the electrons are such that they can be extrapolated to intersect at a plurality of different regions within the photocathode, the plurality of different regions defining a plurality of virtual sources located within the photocathode which is configured to be aspheric, and wherein the photocathode comprises an aspheric rounded tip which has more than one radius of curvature;
   configuring the emitted electrons so that they form an electron beam;
   focusing the electron beam onto a specimen to form images of the plurality of virtual sources on the specimen, wherein each of the plurality of virtual sources is positioned so as to compensate for optical aberration such that images of each of the plurality of virtual sources are located within a selected predefined region on the specimen so that the predefined region is irradiated.

2. The method according to claim 1 wherein the method is a method of preparing a specimen for inspection and the step of focusing the electron beam onto a specimen to form images of the plurality of virtual sources on the specimen is done so that the specimen is prepared for inspection.

3. The method according to claim 1 wherein the predefined region is selected so that each of the plurality of virtual sources are located on the specimen so as to achieve a reduction in the size of the virtual source image.

4. The method according to claim 1, further comprising the step of tuning the focal length of one or more lenses used to focus the electron beam, so that electrons in the electron beam do not cross-over before reaching the specimen.

5. The method according to claim 1, comprising the step of accelerating said electron beam.

6. The method according to claim 1, comprising the step of modifying convergence of said electron beam using one or more lenses.

7. The method according to claim 1, comprising the step of controlling angular span of the electron beam.

8. The method according to claim 1, wherein said photocathode is irradiated from a backend thereof, wherein the backend of the photocathode is an end of the photocathode which is opposite to an end from which electrons are emitted.

9. The method according to claim 1, wherein said photocathode is irradiated from a frontend thereof, wherein the frontend of the photocathode is an end of the photocathode from which electrons are emitted.

10. An electron beam apparatus comprising:
    a photocathode;
    a means for irradiating said photocathode so that the photocathode will emit electrons from a surface of the photocathode, wherein the trajectory of an electron is such that it can be extrapolated to intersect a region within the photocathode, the region defining a virtual source;
    a means for configuring the emitted electrons into an electron beam;
    a means for focusing the electron beam onto a specimen so that an image of the virtual source can be formed on the specimen;
    and wherein the photocathode comprises a rounded tip which has a radius of curvature, so that the size of the virtual source is reduced and thus the smaller image of the virtual source is achievable, wherein the tip of the photocathode is configured to be aspheric so that electrons emitted from the cathode follow a plurality of different trajectories, and the plurality of trajectories of the electrons are such that they can be extrapolated to intersect at a plurality of different regions within the photocathode, the plurality of different regions defining a plurality of virtual sources located within the photocathode, wherein each of the plurality of virtual sources is positioned so as to compensate for optical aberration, such that images of each of the plurality of virtual sources are located within a selected predefined region on the specimen to achieve an reduction in the size of the virtual source image.

11. The electron beam apparatus according to claim 10 wherein a second portion is configured to have a radius of curvature different to the radius of curvature of the rounded tip.

12. The electron beam apparatus according to claim 10 wherein the photocathode is a point photocathode.

13. A method suitable for preparing a specimen for inspection, the method comprising the steps of:
    irradiating a photocathode so that the photocathode emits electrons from a surface of the photocathode, wherein the emitted electrons each follow a trajectory, and the trajectories of the electrons are such that they can be extrapolated to intersect at a region within the photocathode, the region defining a virtual source, and wherein the photocathode comprises a rounded tip which has a radius of curvature;
    configuring the emitted electrons so that they form an electron beam;
    focusing the electron beam onto a specimen to form an image of the virtual source on the specimen;
    irradiating a photocathode which is configured to be aspheric so that electrons emitted from photocathode follow a plurality of different trajectories, the plurality of trajectories can be extrapolated to intersect at a plurality of different regions within the photocathode, each of the plurality of different regions defining a plurality of virtual sources located within the photocathode which is configured to be aspheric, wherein each of the plurality of virtual sources is positioned so as to compensate for optical aberration such that images of each of the plurality of virtual sources are located within a selected predefined region on the specimen so that the predefined region is irradiated, wherein the predefined region is selected so that each of the plurality of virtual sources images are located on the specimen so as to achieve a reduction in the size of a probe, wherein the probe is the sum of all the virtual source images.

14. A method suitable for preparing a specimen for inspection, the method comprising the steps of:

irradiating a photocathode so that the photocathode emits electrons from a surface of the photocathode, wherein the emitted electrons each follow a trajectory, and the trajectories of the electrons are such that they can be extrapolated to intersect at a region within the photocathode, the region defining a virtual source, and wherein the photocathode comprises a rounded tip which has a radius of curvature;

configuring the emitted electrons so that they form an electron beam;

focusing the electron beam onto a specimen to form an image of the virtual source on the specimen;

irradiating a photocathode which is configured to be aspheric so that electrons emitted from photocathode follow a plurality of different trajectories, the plurality of trajectories can be extrapolated to intersect at a plurality of different regions within the photocathode, each of the plurality of different regions defining a plurality of virtual sources located within the photocathode which is configured to be aspheric, wherein each of the plurality of virtual sources is positioned so as to compensate for optical aberration so that the electrons emitted from the plurality of virtual sources are all incident on the same point on the specimen so as to achieve a reduction in the size of the size of a probe, wherein the probe is the sum of all the virtual source images.

* * * * *